United States Patent [19]
Tabara

[11] Patent Number: 5,399,527
[45] Date of Patent: Mar. 21, 1995

[54] METHOD OF FORMING MULTILAYER ALUMINUM WIRING IN SEMICONDUCTOR IC

[75] Inventor: Suguru Tabara, Hamamatsu, Japan

[73] Assignee: Yamaha Corporation, Hamamatsu, Japan

[21] Appl. No.: 36,673

[22] Filed: Mar. 25, 1993

[30] Foreign Application Priority Data

Mar. 28, 1992 [JP] Japan .................................. 4-102307

[51] Int. Cl.$^6$ ................... H01L 21/265; H01L 21/283
[52] U.S. Cl. ...................................... 437/194; 437/190; 437/195; 437/200; 156/628; 156/643; 148/DIG. 15
[58] Field of Search ............... 156/628, 643, 656; 437/190, 194, 195, 200; 148/DIG. 15

[56] References Cited

U.S. PATENT DOCUMENTS

| | | | |
|---|---|---|---|
| 4,663,643 | 5/1987 | Mimura . | |
| 4,782,380 | 11/1988 | Shankar et al. | 437/190 |
| 5,081,064 | 1/1992 | Inoue et al. | 437/190 |
| 5,082,801 | 1/1992 | Nagata | 437/190 |
| 5,234,864 | 8/1993 | Kim et al. | 156/646 |

FOREIGN PATENT DOCUMENTS 2-134818  5/1990  Japan .

OTHER PUBLICATIONS

Wolf, *Silicon Processing for the VLSI Era*, vol. 2, Lattice Press, Sunset Beach, Calif., 1990, pp. 264, 268–272.
Guggina, W. H., et al, "Characterization of GaAs/Al Ga As selective reactive ion etching . . . ", J. Vac. Sci. Technol. B8(6), Nov./Dec. 1990.

*Primary Examiner*—T. N. Quach
*Attorney, Agent, or Firm*—Spensley Horn Jubas & Lubitz

[57] ABSTRACT

A lower wiring layer is formed on an insulating film 12 covering a semiconductor substrate 10. The wiring layer 14 has a laminated structure of a barrier metal layer such as $WSi_2$, an Al or Al alloy layer, and a cap metal layer such as $WSi_2$ formed in this order from the bottom. The cap metal layer is caused to contain conductive material such as Al by using an ion injection method or the like. After forming an insulating film covering the wiring layer, a contact hole is formed in the insulating film by a dry etching process using a resist layer as a mask. The dry etching process uses a fluorine based gas such as $CHF_3$ as the etching gas. With this etching gas, fluoride such as Al fluoride ($AlF_3$) is generated to suppress the etching of the cap metal layer.

24 Claims, 3 Drawing Sheets

METHOD OF FORMING MULTILAYER ALUMINUM WIRING IN SEMICONDUCTOR IC

BACKGROUND OF THE INVENTION a) Field of the Invention

The present invention relates to a method of forming a multilayered wiring, for the manufacture of LSI or the like, and more particularly to such a method capable of preventing a cap metal layer of an under wiring layer from being etched out completely, by forming a contact hole by a dry etching using a fluorine based etching gas after introducing a conductive material such as Al to the cap metal layer.

b) Description of the Related Art

A known conventional method of forming a multilayered wiring for LSI or the like is illustrated in FIG. 9. A lower wiring layer 2 is first formed on an insulating film 1, the lower wiring layer 2 having a laminated structure of a barrier metal layer 2a, Al or Al alloy layer 2b, and a cap metal layer 2c formed in this order from the bottom. Thereafter, an insulating film 3 is formed covering the lower wiring layer 2. A contact hole 3A is formed in the insulating film 3 by a selective dry etching method. An upper wiring layer 4 is formed on the insulating film 3 and connected to the lower wiring layer 2 via the contact hole 3A.

The barrier metal layer 2a is used for providing a good ohmic contact with the surface of the silicon substrate under the insulating film 1, and is made of a conductive material such as $WSi_2$, $MoSi_2$, and TiW. The barrier metal layer 2a is also used for preventing penetration of aluminum into silicon substrate during a heat treatment. The cap metal layer 2c is used for preventing a conduction defect (non-ohmic) to be caused by silicon nodules SN generated by precipitation of excessive silicon in silicide or Al alloy into the lower wiring layer 2b and filling the contact hole 3A, and is made of a conductive material such as $WSi_2$, $MoSi_2$, or TiW.

In the dry etching process of forming the contact hole 3A, a mixed gas (such as $CHF_3/He/O_2$, and $CF_4/CHF_3/Ar$) containing a fluorine based gas such as $CHF_3$ is used as the etching gas.

With the above-described conventional method, if the cap metal layer 2c is made of material subjected to etching by a fluorine based plasma gas, the cap metal layer 2c reduces its thickness and may sometimes disappear from the area just under the contact hole 3A. Under this condition, if silicon nodules are formed in the layer 2b under the contact hole, the conduction state between the wiring layer 4 and wiring layer 2 becomes insufficient.

In order to avoid such a case, it is conceivable to form the cap metal layer 2c sufficiently thick so that this layer 2c is not etched out completely. With this method, however, there occur the following two problems. (A) The step at the wiring layer becomes great, degrading the flatness on the substrate upper surface, and (B) if the Al or Al alloy 2b is made thin corresponding in amount to the increased thickness of the cap metal layer 2c, the wiring resistivity increases because the resistivity of the cap metal is higher than the Al or Al alloy layer 2b.

Another method of eliminating such problems is to form a silicon nitride layer under the insulating film 3 as an etching stopper, as described in, for example, Japanese Patent Laid-open Publication No.2-134818. In forming the contact hole 3A in the insulating film 3, made of a thin silicon nitride layer and thick silicon oxide film, the insulating film 3 is etched first under the condition of a faster etching speed of the silicon oxide than the silicon nitride, and then under the condition of a faster etching speed of the silicon nitride than the silicon oxide. In this manner, it is possible to shorten the time while the wiring layer surface is exposed to the etching atmosphere.

With this method, however, the following problems occur. (C) The number of processes required for forming an insulating film increases, and (D) the thickness of the cap metal layer also reduces corresponding in amount to the faster etching speed of the silicon nitride at the second etching step.

SUMMARY OF THE INVENTION

It is an object of the present invention to provide a novel method of forming a multilayered wiring capable of preventing the thinning of the cap metal layer during the contact hole etching process, without the above-described disadvantages (A) to (D).

According to one aspect of the present invention, there is provided a method of forming a multilayered wiring comprising the steps of: forming a lower wiring layer on an insulating surface of a substrate, the lower wiring layer including one of an Al layer and an Al alloy layer, and a cap metal layer formed on the one layer; forming an insulating film on the insulating surface of the substrate, the insulating film covering the lower wiring layer; selectively etching the insulating film by a dry etching process using a fluorine based gas as an etching gas, to form a contact hole at a position corresponding to a contact area of the lower wiring layer; forming an upper wiring layer on the insulating film and connecting the upper wiring layer to the lower wiring layer via the contact hole; and prior to forming the contact hole, introducing a conductive material to the cap metal layer, the conductive material being capable of forming a fluoride acting with fluorine contained in the etching gas.

In this specification, the cap metal layer means a conductive material layer such as $WSi_2$, $MoSi_2$, and TiW formed on the Al or Al alloy layer in order to prevent insufficient conduction at the contact hole, and the cap metal layer is not limited only to the layer made of metal.

Conductive material such as Al capable of generating fluoride is contained in the cap metal layer. Therefore, when the etching starts for the cap metal layer, fluoride (such as $AlF_3$) is generated to suppress the etching of the cap metal layer. It is therefore easy to stop the etching before the cap metal layer is completely etched and removed.

As above, with the cap metal layer containing conductive material such as Al, the cap metal layer can be prevented from being completely removed during the contact hole etching. Accordingly, it is possible to prevent insufficient conduction to be otherwise caused by silicon nodules, improving the manufacturing yield.

DETAILED DESCRIPTION OF THE PREFERRED EMBODIMENTS

FIGS. 1 to 6 are cross sectional views explaining a method of forming a multilayered wiring according to an embodiment of the present invention. The processes (1) to (6) of this method corresponding to FIGS. 1 to 6 will be described in this order.

(1) On the surface of a semiconductor substrate 10 such as silicon, an insulating film 12 such as silicon oxide is formed. On this insulating film 12, a barrier metal layer 14A, an Al or Al alloy layer 14B, and a cap metal layer 14C are sequentially formed in this order. The barrier metal layer 14A and cap metal layer 14C may be made of any suitable material such as $WSi_2$, $MoSi_2$, and TiW. Al or Al alloy forming the main conductive region may be generally called Al alloy.

Figure 1:
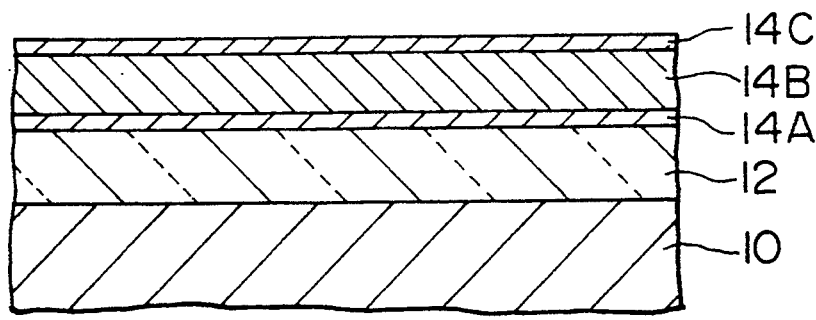
FIGS. 1 to 6 are cross sectional views explaining a method of forming a multilayered wiring according to an embodiment of the present invention.
Figure 2:
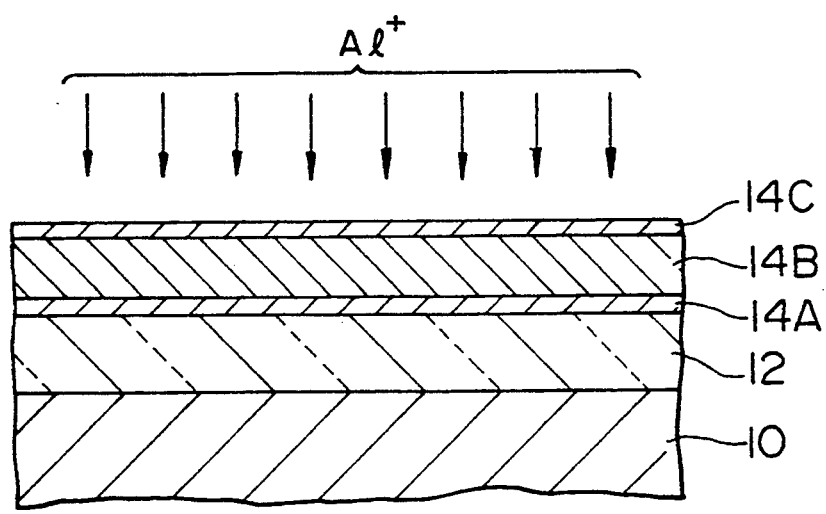
Figure 3:
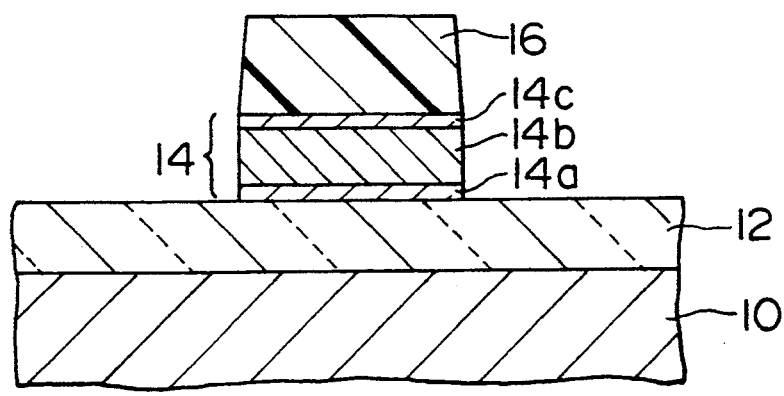
Figure 4:
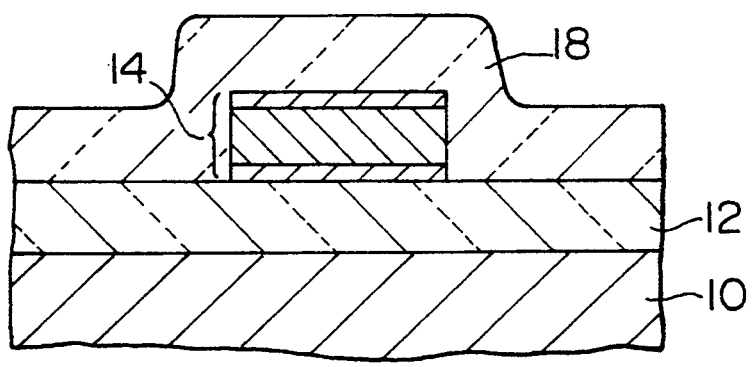
Figure 5:
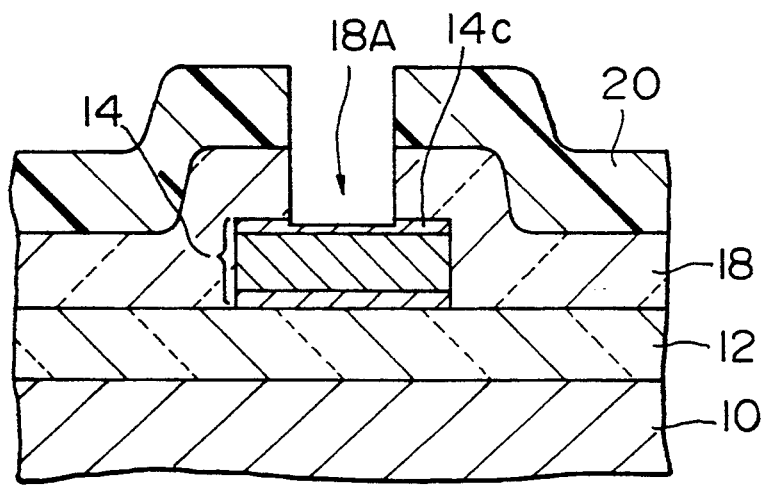
Figure 6:
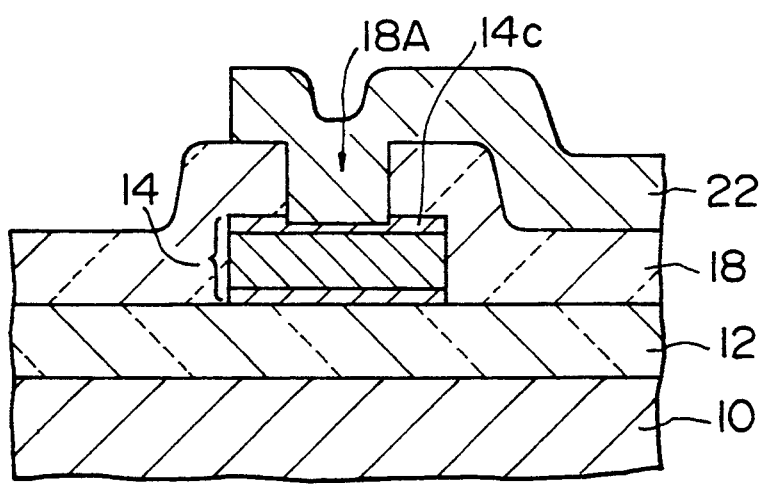
Figure 7:
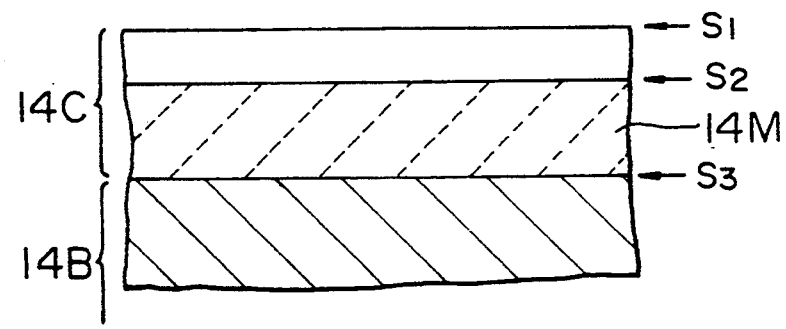
FIG. 7 is an enlarged cross sectional view showing the upper portion of the wiring material layer.
Figure 8:
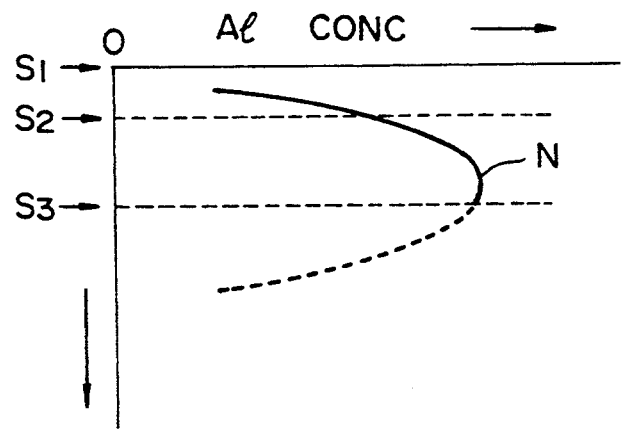
FIG. 8 is a graph showing the Al concentration distribution at the upper portion of the wiring material layer.
Figure 9:
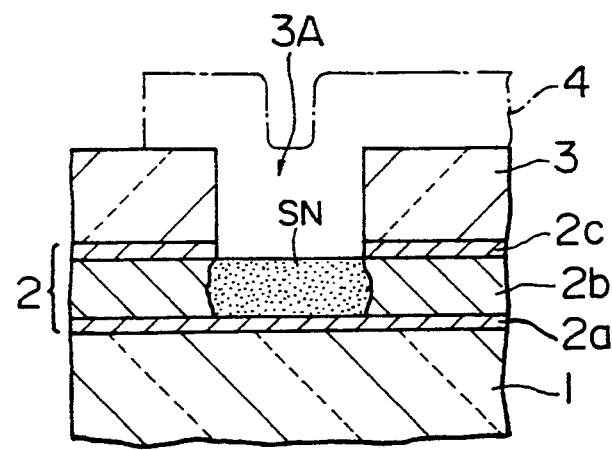
FIG. 9 is a cross sectional view explaining a conventional method of forming a multilayered wiring.

(2) Next, Al ions are injected into the wiring layer constituted by the layers 14A to 14C to form an Al containing layer (a mixed layer of cap metal and Al) 14M near the Al or Al alloy layer 14B as shown in FIG.7. The injection of Al ions is performed by using a source gas of $AlCl_3$ at a dose of at least $5*10^{15}$ cm$^{-2}$. The acceleration voltage at the ion injection is preferably set, as indicated by a curve N shown in FIG. 8, to the value allowing the peak of Al concentration distribution (Gaussian distribution) to position within the cap metal layer 14C. In FIGS. 7 and 8, $S_1$ represents the surface position of the cap metal layer 14C, $S_2$ represents the position exposing the Al containing layer 14M after the contact hole etching process, and $S_3$ represents the interface position between the Al containing layer 14M and the Al or Al alloy layer 14B.

(3) Next, the wiring layer formed by the layers 14A to 14C is patterned by a dry etching process using a resist layer 16 as tile mask, to form a wiring layer 14 formed by the remaining portions 14a to 14c of the layers 14A to 14C.

(4) After removing the resist layer 16, an insulating film 18 such as silicon oxide is formed on the insulating film 12 and wiring layer 14, for example, by a plasma chemical vapor deposition method.

(5) Next, a contact hole 18A is formed in the insulating film 18 by a dry etching process using a resist layer 20 as the mask. In this dry etching process, plasma of a mixed gas (e.g., $CHF_3/O_2$, $CF_4/CHF_3/Ar$, and $CHF_3/He/O_2$ containing a fluorine based gas is used. The insulating film 18 of silicon oxide is therefore etched with highly volatile $SiF_4$, and removed from the substrate upper surface.

In contrast, when Al is etched with the fluorine based gas, Al fluoride ($AlF_3$) having a low vapor pressure is generated and it suppresses the etching process. The etching speeds were measured for an $SiO_2$ film (deposited by a plasma CVD method), an Al-1%Si-0.5% Cu alloy layer, and a $WSi_2$ layer, by using a narrow gap reactive ion etching apparatus, under the conditions of $CHF_3/He/O_2 = 20/88/3.5$ sccm, pressure 260 Pa, and RF power 500 W. The measurement results are given in the following table.

| Etched Material | Etching Speed (nm/min.) | Selection Ratio |
|---|---|---|
| $SiO_2$ | $V_1 = 422.5$ | |
| Al—Si—Cu | $V_2 = 1.04$ | $V_1/V_2 = 411$ |
| $WSi_2$ | $V_3 = 30.0$ | $V_1/V_3 = 14.1$ |

The etching speed for Al—Si—Cu is very slow, and the selection ratio $V_1/V_2$ between $SiO_2$ and Al—Si—Cu is very high. The etching surface of the cap metal layer 14C containing Al is covered with $AlF_3$, so that the etching selection ratio relative to the insulating film 18 made of silicon oxide is greatly improved and the etching is easily stopped at the position S2 shown in FIG. 7. Namely, the Al containing layer 14M is left just under the contact hole 18A and operates like the cap metal. It is therefore possible to prevent conduction defect to be otherwise caused by silicon nodules in the contact hole.

A change of the etching speed for $WSi_2$ relative to the Al injection amount, and a change of the selection ratio relative to a silicon oxide film formed by plasma, were measured, using a source gas $AlCl_3$. The results are given in the following table.

| Al + Injection Amount (cm$^{-2}$) | Acceleration Voltage (kV) | $WSi_2$ Etching Speed (Å/min) | Selection Ratio |
|---|---|---|---|
| 0 | | 290.8 | 13.9 |
| $5 * 10^{13}$ | 60 | 293.4 | 13.8 |
| | 100 | 290.2 | 13.9 |
| $5 * 10^{15}$ | 60 | 283.8 | 14.2 |
| | 100 | 275.2 | 14.7 |

As seen from this table, the etching speed lowers at the Al ion injection amount of $5*10^{15}$ cm$^{-2}$ or more. It is therefore necessary to use Al ions of $5*10^{15}$ cm$^{-2}$ or more.

(6) Thereafter, wiring material such as Al and Al alloy is deposited and patterned to form an upper wiring layer 22 on the substrate upper surface which layer is connected to the lower wiring layer 14 via the contact hole 18A. In the present embodiment, the Al containing layer 14M remains on the cap metal layer 14C, thus the Al containing layer 14M and the cap metal layer 14C function as a conductive bypass layer against electrical disconnection between the wiring layer 22 and 14 caused by silicon nodules SN.

The present invention is not limited only to the above embodiment. For example, the injection of Al ions may be performed after forming the wiring layer 14 at the process shown in FIG. 3. Furthermore, Al may be contained in the cap metal layer 14C by means of a sputtering process or the like. Still further, conductive material to be contained in the cap metal layer is not limited to Al, but other materials capable of forming fluoride (particularly fluoride having a low vapor pressure) such as Cr, Sr, Ti, Cu, Ni, and Mg may also be used. For ion injection, Cr and Ti are preferable. For the injection of Cr ions and Ti ions, $CrC_4$, $CrO_2C_2$, $TiCl_4$ for example may be used as the source gas.

I claim:

1. A method of forming a multilayered wiring comprising the steps of:

forming a lower wiring layer on an insulating surface of a substrate, said lower wiring layer comprising a conduction layer consisting of Al or an Al alloy and a cap metal layer formed on said conduction layer, wherein said cap metal layer consists essentially of materials that are readily etched by a fluorine based plasma gas;

introducing a conductive material to said cap metal layer that reacts in a fluorine based plasma gas to form a material that is not readily etched by a fluorine based plasma gas;

forming an insulating film on said insulating surface of said substrate, said insulating film overlying said lower wiring layer;

selectively etching said insulating film by a dry etching process using a fluorine based gas as an etching gas to form a contact hole at a position corresponding to a contact area of said lower wiring layer;

forming an upper wiring layer on said insulating film and connecting said upper wiring layer to said lower wiring layer via said contact hole.

2. A Method according to claim 1, wherein said cap metal layer is made of at least one material selected from a group consisting of $WSi_2$, $MoSi_2$, and TiW.

3. A method according to claim 2, wherein said conductive material reacts in the presence of a fluorine based plasma gas to form a fluoride.

4. A method according to claim 1, wherein said step of introducing said conductive material to said cap metal layer includes a step of injecting ions into said lower wiring layer after said step of forming said lower wiring layer.

5. A method according to claim 1, wherein said step of selectively etching said insulating film includes a step of forming a resist pattern, and said step of introducing said conductive material to said sap metal layer includes a step of injecting ions via said resist pattern.

6. A method according to claim 1 wherein said conductive material comprises Al and wherein said conductive material reacts to form a fluoride of Al which accumulates at an edge of said cap metal layer to inhibit etching of said cap metal layer.

7. A method according to claim 1 wherein said conductive material is different from any constituent of said cap metal layer.

8. A method of forming a multilayered wiring comprising the steps of:

forming a lower wiring layer on an insulating surface of a substrate, the lower wiring layer including a conduction layer formed of Al or an Al alloy and a cap metal layer formed on the conduction layer;

injecting metal ions into the cap metal layer, after the step of forming a lower wiring layer, the metal being different from any constituent element of the cap metal layer;

forming an insulating film to cover the lower wiring layer;

selectively etching the insulating film by a dry etching process using a fluorine based gas as an etching gas, forming a contact hole through the insulating layer at a position corresponding to a contact area of the lower wiring layer, the metal ions injected into the cap metal layer being capable of reacting with fluorine contained in the etching gas to form a fluoride on a surface of the cap metal layer, the fluorine suppressing etching of the cap metal layer;

forming an upper wiring layer on the insulating film; and connecting the upper wiring layer to the lower wiring layer via the contact hole.

9. A method of manufacturing a multilayered wiring structure having an upper wiring layer and a lower wiring layer, comprising the steps of:

(a) forming the lower wiring layer having a first sublayer which acts as a primary conduction path within the lower wiring layer and a second sublayer that prevents the formation of defects in the first sublayer;

(b) injecting ions of a metal into the second sublayer, the metal having a property of reacting with fluorine to form a fluoride having a low vapor pressure;

(c) forming an interlevel insulating layer on the lower wiring layer; and (d) selectively etching the interlevel insulating layer with a gas including fluorine as a constituent element, forming a contact hole through the interlevel insulating layer and exposing a part of the second sublayer to the gas, wherein the metal ions injected into the second sublayer react with fluorine in the gas to form a fluoride, suppressing etching of the second sublayer.

10. A method according to claim 9 further comprising the steps of:

(e) forming the upper wiring layer on the interlevel insulating layer to form a connection between the upper wiring layer and lower wiring layer through the contact hole.

11. A method according to claim 9 wherein the metal ions are aluminum ions.

12. A method according to claim 9 wherein the metal is selected from a group consisting of chromium and titanium.

13. A method according to claim 9 wherein the metal is selected from a group consisting of strontium, copper, nickel and magnesium.

14. A method according to claim 9 wherein an amount of metal ions injected into the second sublayer is $5 \times 10^{15}$ cm$^{-2}$ or more.

15. A method according to claim 9 wherein the metal ions are injected into the second sublayer to establish a peak concentration of the metal within the second sublayer.

16. A method according to claim 9, wherein the gas in step (d) includes a species selected from the group consisting of $CHF_3$, $CF_4$ and mixture gases thereof.

17. A method according to claim 16, wherein the gas further includes equivalent species selected from the group consisting of $O_2$, Ar, He and mixture gases thereof.

18. A method according to claim 9, wherein the second sublayer comprises at least one material selected from a group consisting of $WSi_2$, $MoSi_2$ and TiW.

19. A method of manufacturing a multilayered wiring structure having an upper wiring layer and a lower wiring layer, comprising the steps of:

(a) forming a lower wiring layer having a first sublayer serving as a main conductive layer within the lower wiring layer, the first sublayer being made of first metal or alloy thereof, and a second sublayer for preventing the formation of defects in the first sublayer, the second sublayer being made of a second metal which is different from the first metal;

(b) injecting ions of the first metal into the second sublayer, the metal having a property of reacting with fluorine to form a fluoride having a low vapor (c) forming an interlevel insulating layer on the lower wiring layer; and (d) selectively etching the interlevel insulating layer with a gas including fluorine as a constituent element, forming a contact hole through the interlevel insulating layer and exposing a part of the second sublayer to the gas, the metal injected into the second sublayer reacting with fluorine included in the gas to form fluoride which suppresses etching of the second sublayer.

20. A method according to claim 19 wherein the first metal is aluminum.

21. A method according to claim 19 wherein the metal injected into the second sublayer forms a peak of concentration distribution within the second sublayer.

22. A method according to claim 19, wherein the gas in step (d) includes one species selected from the group consisting of $CHF_3$, $CF_4$ and mixture gases thereof.

23. A method according to claim 19, wherein the gas further includes one species selecting from the group consisting of $O_2$, Ar, He and mixture gases thereof.

24. A method according to claim 19, wherein the second sublayer comprises at least one material selected from a group consisting of $WSi_2$, $MoSi_2$ and TiW.

* * * * *